United States Patent [19]

Cane

[11] Patent Number: 5,606,912
[45] Date of Patent: Mar. 4, 1997

[54] SCREEN PRINTING TENSIONING DEVICE

[76] Inventor: Paul Cane, 12 Brackendale Avenue, Preston, Weymouth, Dorset, Great Britain, DT3 68X

[21] Appl. No.: 411,774

[22] PCT Filed: Sep. 30, 1993

[86] PCT No.: PCT/GB93/02040

§ 371 Date: Jun. 28, 1995

§ 102(e) Date: Jun. 28, 1995

[87] PCT Pub. No.: WO94/07696

PCT Pub. Date: Apr. 14, 1994

[30] Foreign Application Priority Data

Oct. 1, 1992 [GB] United Kingdom ................... 9220727

[51] Int. Cl.⁶ .................................................. B05C 17/08
[52] U.S. Cl. ........................................ 101/127.1; 101/127
[58] Field of Search .................. 101/127.1, 128, 101/128.1, 127; 38/102.3, 102.91; 160/378, 374, 374.1, 372, 373

[56] References Cited

U.S. PATENT DOCUMENTS

| 2,925,774 | 2/1960 | Scheeler | 101/127.1 |
| 3,971,312 | 7/1976 | Carli | 101/128.1 |
| 5,044,306 | 9/1991 | Erdmann | 101/123 |

FOREIGN PATENT DOCUMENTS

| 1012371 | 7/1952 | France . |
| 1068277 | 11/1959 | Germany . |
| 3045241 | 7/1982 | Germany . |
| 3205541 | 8/1983 | Germany . |
| 3227434 | 1/1984 | Germany . |
| 3236761 | 4/1984 | Germany . |
| 3245346 | 6/1984 | Germany . |
| 2295793 | 12/1990 | Japan . |

*Primary Examiner*—Edgar S. Burr
*Assistant Examiner*—Daniel J. Colilla
*Attorney, Agent, or Firm*—Brooks & Kushman P.C.

[57] ABSTRACT

A tensioning device for mounting a stencil foil in a fixed position in a first plane and having tensioning means. The tensioning means including a tensioning member and a lever, the tensioning member being positioned to directly engage and move the foil to control the tension therein. The lever means being angularly movable and operable to displace a major portion of the stencil foil from the first plane, in which the stencil was initially mounted, to a second plane displaced from the first plane. The displacement of the portion of the stencil foil places the stencil foil under tension. In the preferred embodiment, the tensioning member is in the form of an elongate cam member.

5 Claims, 2 Drawing Sheets

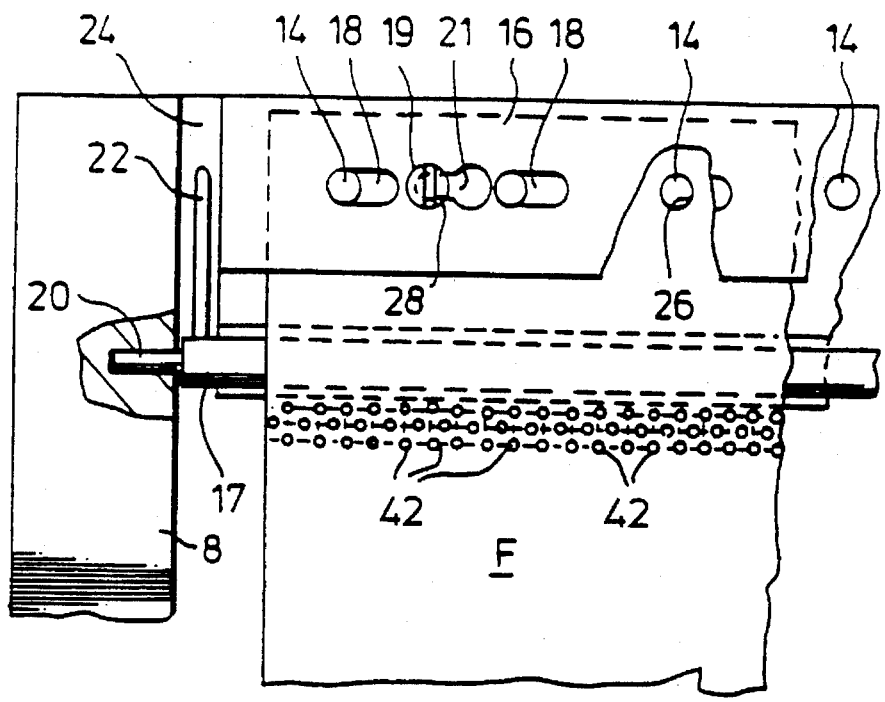
FIG.4
FIG.5
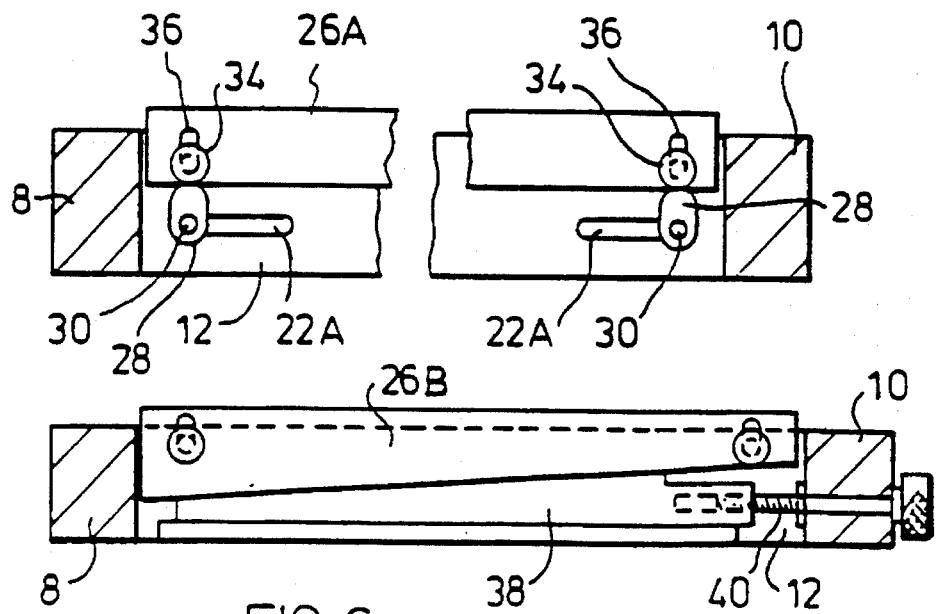
FIG.6

SCREEN PRINTING TENSIONING DEVICE

This invention relates to screen printing and is particularly concerned with a mounting arrangement for screen stencils used in such a process.

Screen printing is well-known whereby ink, paint or other media is passed through apertures formed in a stencil onto the surface of a chosen material.

This same process is used in the preparation of printed circuit boards where an amount of solder paste is deposited on the stencil and is then squeegeed through the apertures to the surface of a printed circuit board positioned therebelow. The stencil is usually made of thin stainless steel or other suitable metal foil.

Because of the demands for extreme accuracy in solder printing of circuit boards, the stencil is precisely positioned within a frame under tension and the frame is mounted in position on parts of the printing machine.

In one current practice a pre-tensioned mesh is first bonded to a rigid framework, the perimeter of the stencil foil is bonded to the mesh and then the mesh is removed from the printing area. Thus the tension present in the mesh is transmitted to the stencil foil. This system is complicated, time consuming and therefore costly. Furthermore the stencil foil and the frame become a semi-permanent assembly which demands substantial storage space, each stencil requiring a separate frame.

In an attempt to overcome that problem an arrangement has been devised and is described in PCT patent specification WO 92/08616 whereby edgemost portions of the stencil foil are formed with slots which are located over studs on the frame. The frame is then placed in tension pneumatically to rigidify the foil to some degree. However it is found that this arrangement is expensive to manufacture, requires connection to a source of pneumatic power and furthermore, because the pneumatic device can only act on the lateral ends of the frame member, the tension is unevenly distributed across the foil giving rise to so-called "strain lines" with consequent distortion of the apertures and inaccurate deposition of solder paste onto the printed circuit boards.

An object of the invention is to overcome or mitigate one or more of the shortcomings of previous systems and devices, and/or to provide improvements generally.

According to the invention there is provided a method of mounting a stencil foil under tension on a mounting therefor, wherein the foil is tensioned by mechanical means located to act on the foil at least at one end thereof. The invention also provides a method of screen printing comprising the step of mounting a stencil foil under tension, as defined above.

The mechanical means may act directly on the foil. The mechanical means may have a progressive action, and/or an action produced by angular movement of a mechanical member. Preferably, the mechanical means is in the form of cam means. The mechanical means may be disposed so as to act on the foil lengthwise in a region extending transverse to the direction in which the foil is tensioned. The foil may lie in one plane in its untensioned state, and in another plane in its tensioned state.

Opposite ends of the foil may be clamped for tensioning purposes. In the region of the ends, the foil may be weakened to provide strain relief in order to improve the uniformity of tensioning of the foil. Preferably, such weakening is effected by the provision of one or more arrays of perforations in the foil.

In an embodiment the tensioning means for the foil comprises a tensioning member located inwardly of the mounting for the foil, that is to say between opposite sides of the mounting, and positioned for direct engagement with the foil. Actuation of the tensioning member, for example by cam means, moves the tensioning member to set up or increase tension in the foil.

The tensioning member has an elongate surface for engagement with the foil. The elongate surface serves to apply a loading to the foil uniformly along the length of the tensioning member, thereby avoiding the regions of varying tension inherent in systems in which tension is applied at specific locations, such as by pegs or the like.

By arranging for the tensioning member to extend across a major part of the width dimension of the mounting for the foil the uniformity of applied tension is consistent across the entire working width of the stencil. By providing, in addition, a mounting in which the foil is secured to resist the tension applied during use, by means of a clamping plate which exerts a generally uniform clamping action likewise across a major portion of the width of the foil, the entire mounting and tensioning arrangement is rendered uniform widthwise of the foil.

The above and other features of the invention will become clear from the following description which is given by way of example with reference to the accompanying drawings in which:

FIG. 4 is a detail plan view of part of the assembly;

FIG. 5 is an end view of an alternative embodiment; and

FIG. 6 is an end view of yet another alternative embodiment.

Figure 1:
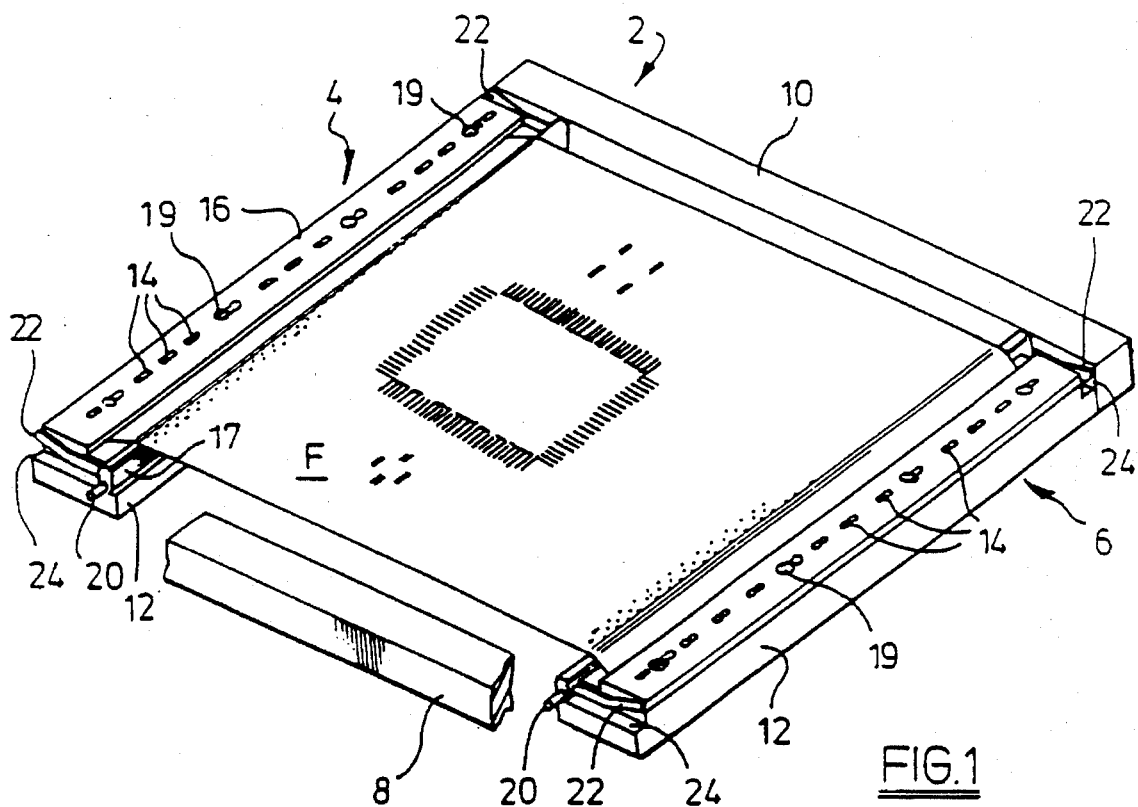
FIG. 1 is a perspective view of the stencil foil assembled with respect to the frame in its tensioned state, parts being removed for clarity.

As seen in the drawings the invention comprises a frame 2 having front and rear frame members 4 and 6 respectively and left and right-hand frame members 8, 10.

Figure 2:
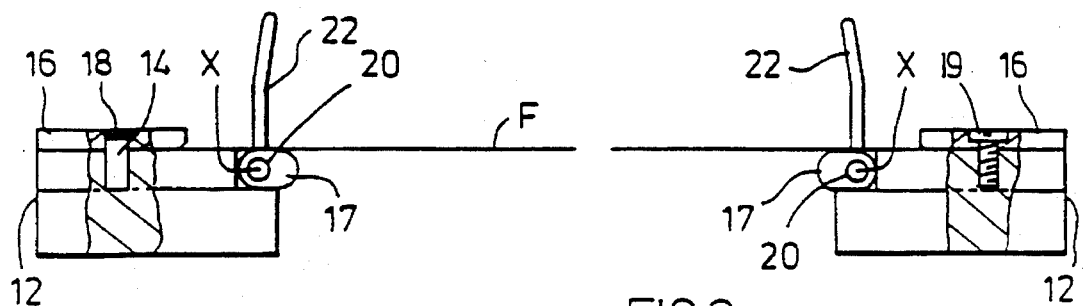
FIG. 2 is a cross-section through an assembled frame and stencil member in its untensioned condition.
Figure 3:
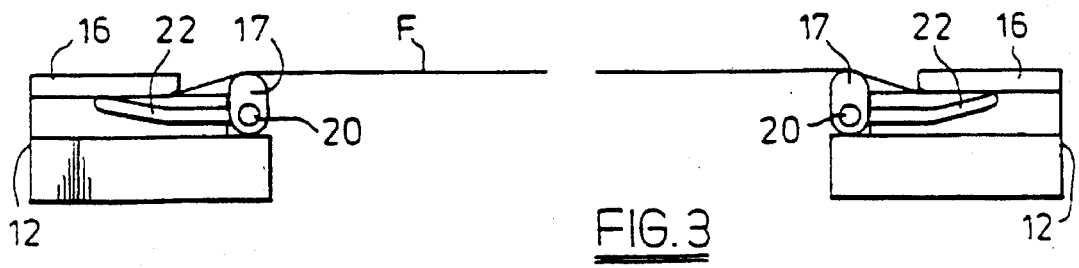
FIG. 3 is a cross-section similar to FIG. 2 but in its tensioned condition.

As seen clearly in FIG. 3 each of the front and rear frame members 4 and 6 comprises a main elongate base member 12 which is attached at its ends to the side members 8, 10. Locating pins 14 project upwardly from the members 12 seen in FIGS. 2 and 3 and a clamping bar 16 is formed with elongate holes 18 which align with the pins 14. Clamping screws 19 pass through clearance holes 21 in the bars 16 into threaded holes in the base members 12. The clearance holes in the clamping bars and conveniently formed as key-hole slots for rapid release and replacement of the bars.

Elongate bars 17 having cam shaped profile sections, extend the length of the base member 12 and are pivotally mounted by pins 20 which are rotatable about the axis X in holes formed in the side members 8, 10. Handles 22 are fixed to and project from the end portions of the cam shaped bars and recesses 24 are formed in the ends of the base members 12 to accommodate those handles when they are in operative tensioning position.

The stencil foil F is formed with holes 26 towards its front and rear edges and the centre distances of these holes are coincident with the centre distances of the locating pins 14 in the base members 12. Further holes 28 are formed in the foil to coincide with the clamping screws 19.

To mount the stencil foil F on the frame 2 the clamping screws 19 are first unscrewed by one or two turns after which the clamping bars 16 are moved to the left as seen in FIG. 4 and then lifted off their respective base members 12, the heads of the screws 19 passing through the large diameter of the key-hole slots.

At this time the cams 17 are in their generally horizontal position as seen clearly in FIG. 2.

The stencil foil F is then positioned on the frame by locating the holes 26 over the pins 14 on both the forward and rearward base members 12 after which the clamping bars are replaced in position and the screws 19 tightened. The foil is thus clamped between the front and rear frames 4 and 6.

In order to place the foil in tension the handles 22 are pushed downwardly to their substantially horizontal position, thereby rocking the cam bars 17 about the axes of their pivot pins 20 to the position shown in FIG. 3. This effectively raises the central part of the foil above its original plane, stretching it within its elastic limit to tension the foil and hence rigidify it to a required degree to ensure accuracy of location of the apertures above the area of the printed circuit board to be printed.

The ready location and clamping of the stencil foil means that only the foils themselves need to be stored, rather than the complete assembly of foils and frames generally, thus saving storage space and reducing the risk of damage in moving the assemblies to and from their storage facility.

Although the specific embodiment illustrated and described refers to a cam shaped bar extending across each of the end frame members 4 and 6, other systems may be used to tension the foil by raising it from a first plane to a second plane. For example, as seen in FIG. 5 there is shown a bar 26A located with respect to the end frame member 4 on cams 28 which are rockable about the axes of pins 30 by means of handles 22A, the bar 26A being guided by headed pins 34 fast in the members 4 and 6 and slideable within slots 36 in the bar 26A.

In a further arrangement (not shown) a toggle linkage system is utilized for raising and lowering the bar 26A.

In a still further arrangement seen in FIG. 6 the lower face of the bar 26B is formed at an angle to its upper face and co-operates with a wedge member 38, movable transversely by means of a screw 40 to raise and lower the level of the bar 26B.

Thus, in both of the alternative embodiments of FIGS. 5 and 6 the foil is raised from a lower plane to a higher plane in order to place it in a degree of tension. The foil may, however, be moved from one plane where it is untensioned, to a lower plane in order to place it under tension.

As seen clearly in FIG. 4 a portion of the stencil adjacent its ends is formed with rows of small diameter holes 42. This has the effect of relieving the strain imposed on the main area of the foil. It is found that by providing these strain relief holes, the tendency of strain lines appearing on the foil is eliminated. Alternatively, similar strain relief may be effected by reducing the cross-sectional area of the foil in the vicinity, eg by etching away part of the surface of the metal.

I claim:

1. A device for mounting under tension a stencil element or foil (F) adapted for stenciling circuitry on boards, the device comprising:

a) a mounting (2) for securing the foil in a fixed position to resist said tension in use, the mounting initially supporting the foil on a first plane;

b) tensioning means for the foil comprising a tensioning member (17) positioned to engage said foil directly and mounted for angular movement about its lengthwise axis which extends across a major part of at least one dimension of said mounting (2) for said foil;

c) said tensioning means being operable such that said tensioning member (17), in use, moves said foil (F) to control the tension therein;

characterised by d) said tensioning means for said foil (F) further comprising actuating lever means (22) connected to said tensioning member (17);

e) said actuating lever means (22) being angularly movable by manual operation to an end position (24) of said lever means defining a tensioning position of said tensioning member (17);

f) whereby movement of said lever means (22) to said end position (24) operates to displace said major part of said one dimension of the foil from said first plane to a second plane spaced from said first plane, said displacement of the foil from said first plane to the second plane thereby placing the foil under tension.

2. A device according to claim 1 characterised by said tensioning member (17) being in the form of an elongate cam member mounted for angular movement with said lever means (22) directly connected thereto.

3. A device according to claim 2 characterised by said lever means (22) being located at opposite ends of said elongate bar.

4. A device according to claim 1 characterised by said lever means being connected to said tensioning members (17) through cams (28, 30) at opposite ends of said tensioning member.

5. A device according to any one of the preceding claims characterised by said mounting (2) being in the form of a rectangular frame and said tensioning means comprising a pair of tensioning members (17) and their associated actuating lever means (22) disposed in generally parallel alignment at opposite sides of said frame.

* * * * *